United States Patent
Hof et al.

(10) Patent No.: US 6,864,988 B2
(45) Date of Patent: Mar. 8, 2005

(54) OPTICAL SYSTEM WITH ISOLATED MEASURING STRUCTURE

(75) Inventors: Albrecht Hof, Aalen (DE); Guenter Maul, Aalen (DE); Michael Muehlbeyer, Aalen (DE); Klaus Mehlkopp, Alsdorf (DE)

(73) Assignee: Carl Zeiss Semiconductor Manufacturing Technologies AG, Oberkochen (DE)

( * ) Notice: Subject to any disclaimer, the term of this patent is extended or adjusted under 35 U.S.C. 154(b) by 252 days.

(21) Appl. No.: 10/186,600

(22) Filed: Jul. 1, 2002

(65) Prior Publication Data

US 2003/0010902 A1 Jan. 16, 2003

(30) Foreign Application Priority Data

Jul. 14, 2001 (DE) .......................................... 101 34 387

(51) Int. Cl.[7] .................................................. G01B 9/02
(52) U.S. Cl. ....................................................... 356/496
(58) Field of Search ................................ 356/35.5, 450, 356/496, 502

(56) References Cited

U.S. PATENT DOCUMENTS

| | | | |
|---|---|---|---|
| 5,633,681 A | 5/1997 | Baxter et al. | 348/373 |
| 6,036,162 A | 3/2000 | Hayashi | 248/550 |
| 6,549,270 B1 | 4/2003 | Ota | 355/55 |

FOREIGN PATENT DOCUMENTS

| | | |
|---|---|---|
| DE | 41 34 016 | 4/1993 |
| EP | 0 397 179 | 11/1990 |

OTHER PUBLICATIONS

"Foundations of Ultraprecision Mechanism Design", S.T. Smith and D.G. Chetwynd, pp. 66–71.

*Primary Examiner*—Samuel A. Turner
*Assistant Examiner*—Michael A. Lyons
(74) *Attorney, Agent, or Firm*—Welsh & Katz, Ltd.

(57) ABSTRACT

An optical system, in particular an exposure lens for semiconductor lithography, with a plurality of optical elements has at least one load-dissipating structure. The load-dissipating structure diverts the forces originating from the optical elements. The optical system also has a measuring structure constructed independently of the at least one load-dissipating structure.

23 Claims, 2 Drawing Sheets

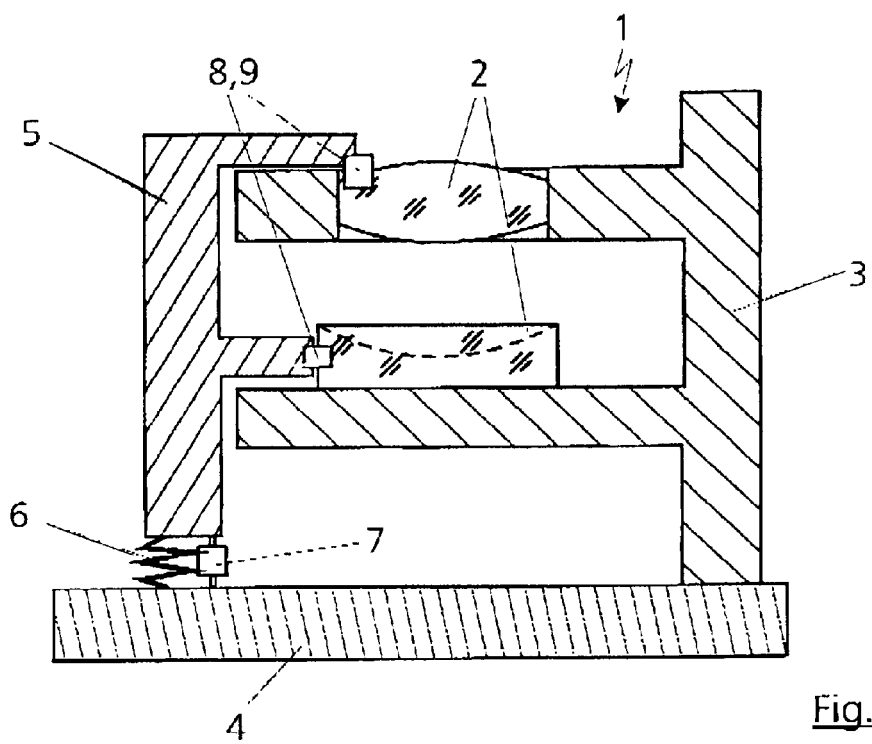
Fig. 1
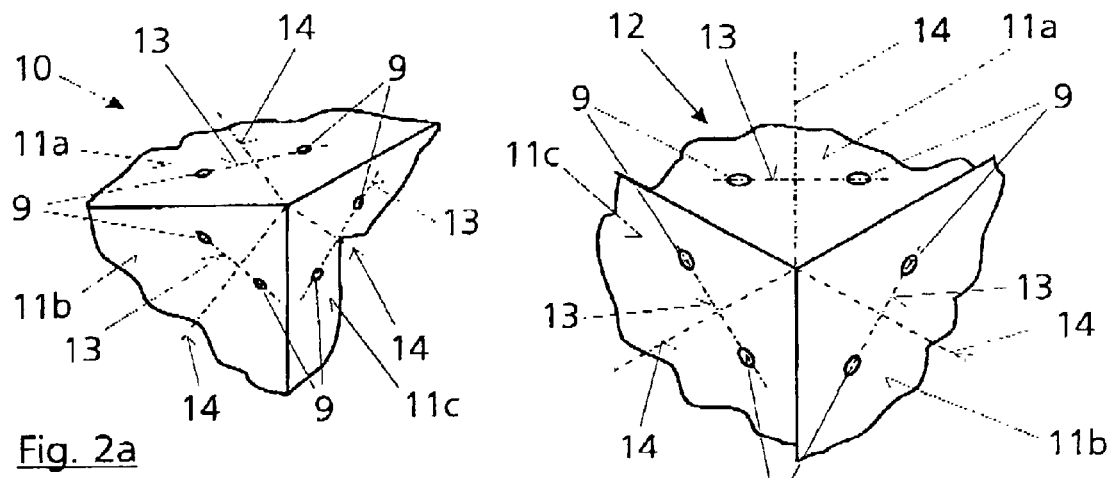
Fig. 2a
Fig. 2b
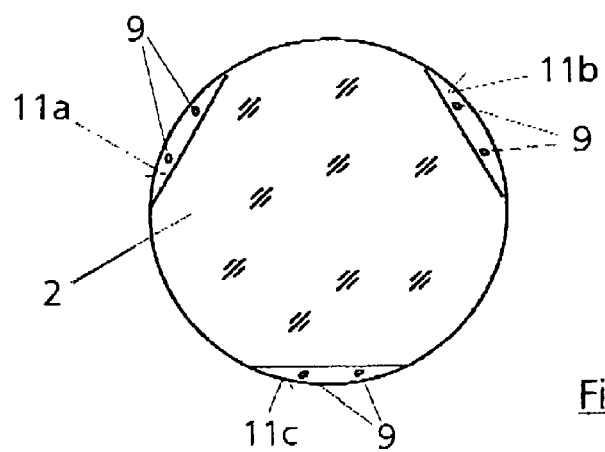
Fig. 3

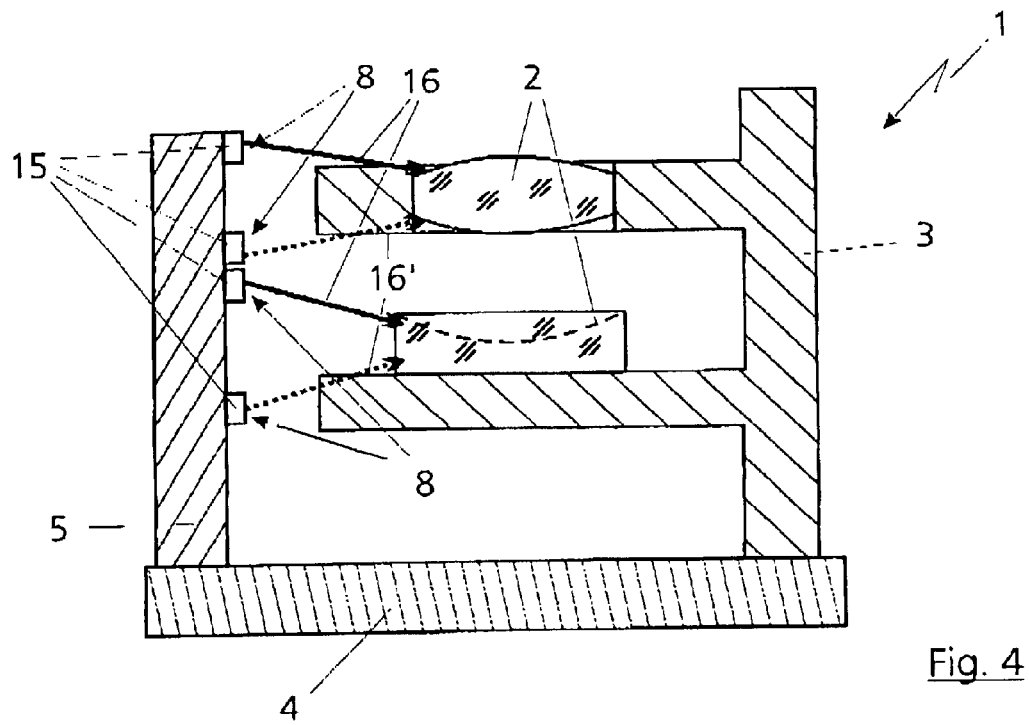
Fig. 4
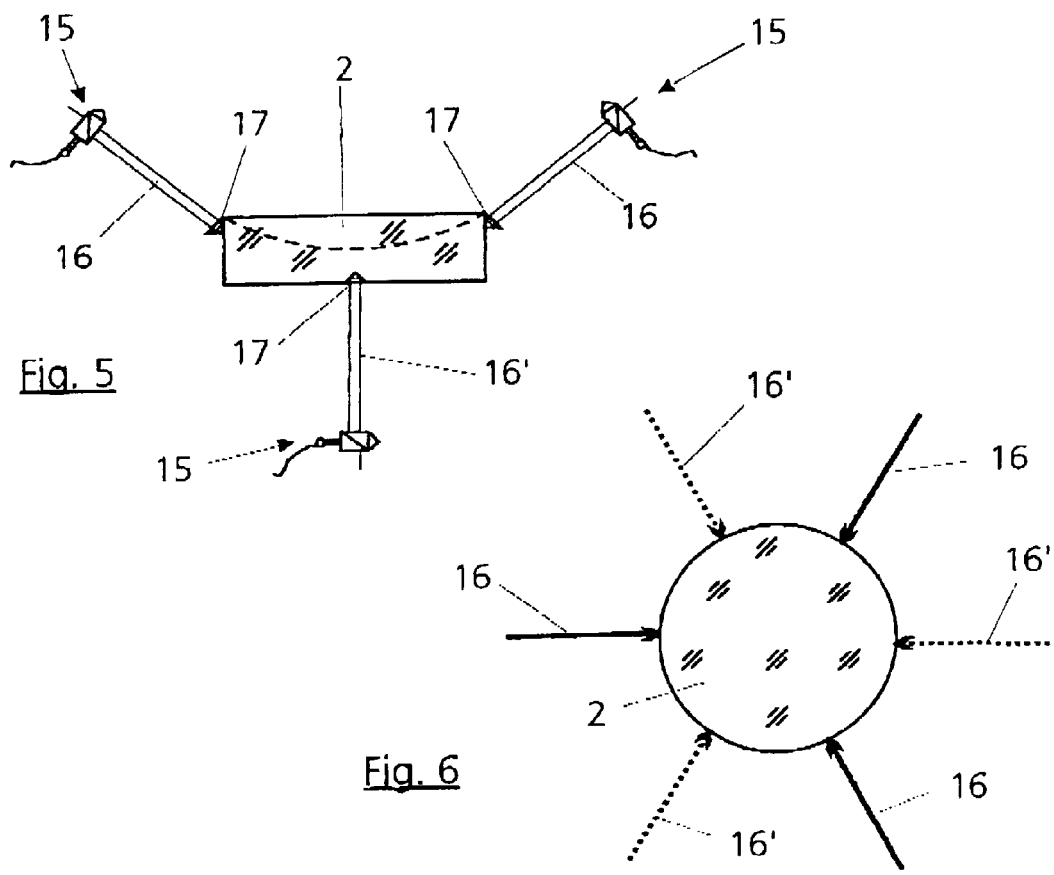
Fig. 5
Fig. 6

OPTICAL SYSTEM WITH ISOLATED MEASURING STRUCTURE

BACKGROUND OF THE INVENTION

1. Field of the Invention

The invention relates to an optical system, in particular an exposure lens for semiconductor lithography with a plurality of optical elements, comprising at least one load-dissipating structure, that diverts the forces originating from the optical elements, and a measuring structure which is constructed independently of said load-dissipating structure. The invention also relates to a method for changing the position of an object and/or an image in such an optical system.

2. Description of the Related Art

In optical systems that are intended to be suitable for generating optical images with a very high accuracy, for example, optical systems for very short-wave radiation such as, for example, radiation in the region of the extreme ultra violet (EUV), it must be possible to position the individual optical elements as exactly as possible with regard to their alignment in all six degrees of freedom.

For this purpose, such optical systems frequently have sensors or the like which appropriately monitor the position of the optical elements, generally mirrors in the above described case of EUV radiation, and manipulators, for the purpose of correcting or adjusting the position of the optical elements.

During operation of such optical systems, which can be exposure lenses for semiconductor lithography, for example, corresponding loads occur on the optical system itself and are absorbed in the latter by a load-dissipating structure. In addition to the static loads resulting from the weight forces of the individual components, there can also be dynamic loads in this case because of vibrations or reaction forces that occur. However, owing to the integration of the sensors in the lens itself these loads are frequently not measured, since the position of the sensors, which is always used as reference for the measurement, is also dependent on such loads.

The basic distinction between force-closed circuits and measuring circuits that on the one hand bear the load and on the other hand include the measurement are described in the specialist article entitled "Foundations of Ultraprecision Mechanism Design" by S. T. Smith and D. G. Chetwynd in "Developments in Nanotechnology" of the University of Warwick, UK, which has been published by GORDON AND BREACH SCIENCE PUBLISHERS.

The closed paths denoted in that article as measuring circuit (measurement loops) are responsible in this case for coordinating the objects to be measured and the measuring tool with one another.

SUMMARY OF THE INVENTION

According it is an object of the present invention to provide an optical system that permits a high accuracy in the required measurements, and thus an exact adjustment of the respective position of the individual optical elements.

It is also an object of the invention to provide a method for changing the position of an object and/or of an image in such an optical system.

The above named object is achieved according to an optical system with a plurality of optical elements, comprising at least one load-dissipating structure, that diverts the forces originating from the optical elements, and a measuring structure which is constructed independently of said load-dissipating structure.

By virtue of the fact that, by contrast with the above named prior art, the optical system contains two structures that are completely separate from one another, one structure being provided as load-dissipating structure for holding the optical elements and for dissipating the weight forces and dynamic force components produced in the region of the optical elements, while the other structure is designed as a pure measuring structure or as a measuring or reference frame, the ideal possibility is created for monitoring the positions of the individual elements held in the load-dissipating structure by comparison with a reliable and constant reference. As already mentioned above, in this case the load-dissipating structure supports the entire load of the optical elements and accepts the reaction forces occurring during a movement of the optical elements. By contrast, the measuring structure supports only its own weight and the weight of any sensors fitted on it, and so a very high stability and accuracy of the measuring structure can be achieved.

In accordance with a particularly favorable improvement of the above named invention, the measuring structure is also integrated in this case in the optical system itself. This results in practice in an optical system that can be used as an inherently closed system in an appropriate machine or the like, in particular as an exposure lens for semiconductor lithography in an appropriate scanner, stepper or the like, in the preferred embodiment.

The optical system permits the individual optical elements to be positioned a way that is inherently exact and virtually independent of the external circumstances, resulting in a uniformly good quality of imaging independently of ambient conditions, effects of aging and setting or the like.

In a method for changing the position of an object and/or an image in an optical system the position of the object and/or the image is varied by varying the position of said optical elements in the optical system, wherein the position of said optical elements in relation to said measuring structure being measured at an at least known position of the object and target position of the image in relation to said measuring structure.

Substantial simplifications with regard to the periphery of the optical system arise by virtue of the fact that the position of the object and/or of the image can be varied by varying the position of the optical elements in the optical system. These possibilities for the method result in decisive advantages, particularly in the case of the preferred aim for the use of such an optical system, specifically in the case of the use, already mentioned above, as exposure lens in a scanner for semiconductor lithography.

For example, the position of the reticle, that is to say the mask forming the starting basis for the pattern to be exposed onto the wafer can be corrected by comparison with the exact position of the wafer by feeding the optical element. This requires merely that the position of the reticle and the wafer relative to the measuring structure be known or capable of being measured. The position of the image produced by the optical system can then be adjusted in practice by an appropriate adjustment of the optical elements.

Such a design according to the invention of the optical system, which has corresponding advantages with regard to the imaging quality to be obtained on the basis of the above named reasons would render it possible without difficulty also to correct the position of the object and/or the image by an appropriate variation in the position of the optical elements. Devices for positioning the reticle and/or wafer mechanically which are complicated and comparatively expensive because of the precision mechanics could thereby be eliminated or at least simplified, since the corresponding corrections are rendered easily possible by a displacement of the respective optical elements with reference to the measuring structure.

Further advantageous improvements of the invention follow from the remaining subclaims and from the exemplary embodiments illustrated below with the aid of the drawing, in which:

BRIEF DESCRIPTION OF THE DRAWINGS

FIG. 1 shows an illustration of the principle of an optical system according to the invention;

FIG. 2a shows a possible arrangement of ranging sensors at a cube corner;

FIG. 2b shows a possible arrangement of ranging sensors in a three-dimensional corner;

FIG. 3 shows an arrangement of three planes, required for the measurement, on an optical element;

FIG. 4 shows an illustration of the principle of an optical system according to the invention, in an alternative embodiment;

FIG. 5 shows an illustration of the principle of a possible design in the case of which use is made of interferometric measuring sections; and FIG. 6 shows the design in accordance with FIG. 5, in a plan view of the principle.

DETAILED DESCRIPTION

FIG. 1 shows illustration of the principle of an optical system 1 that has a plurality of optical elements 2. In the very highly schematic exemplary embodiment illustrated here, a lens and a mirror are indicated as optical elements 2. However, it is also fundamentally conceivable to use all known optical elements, the aim being for reflecting optical elements 2, that is to say mirrors, to be used for the preferred aim of using the optical system 1 as an exposure lens in semiconductor lithography in particular in the extreme ultra violet (EUV).

The optical elements 2 are arranged on a load-dissipating structure 3 of the optical system 1 that is likewise illustrated here only very schematically. The load-dissipating structure 3 adsorbs both the static forces, produced by the weight forces of the optical elements 2 and the structure 3 itself, and dynamic forces that may occur, which can occur in the optical system 1 as a whole because of vibrations that the latter experiences.

The optical elements 2 are suspended in the load-dissipating structure 3 with the aid of a mounting technique known per se. They are either mounted in a fixed fashion or can be manipulated within their mounts via appropriate manipulators (not illustrated here but known per se in accordance with the prior art) in, for example, three degrees of freedom, but in all six degrees of freedom in particular.

The load-dissipating structure 3 itself is fitted on a base plate 4 of the optical system 1, in particular being permanently connected to the latter.

Moreover, the optical system 1 has a measuring structure 5 that serves as independent mechanical reference frame and is constructed entirely independently of the load-dissipating structure 3. In the exemplary embodiment indicated in principle in FIG. 1, the measuring structure 5 is constructed via a combination of a spring means 6 and a damper 7 on the base plate 4 of the optical system 1. Consequently a virtually complete decoupling can be achieved between the measuring structure 5 integrated in the optical system 1 and the base plate 4 by means of the corresponding damper 7 and a spring means that is as soft as possible.

In order to obtain as reference frame for the optical system 1 a measuring structure 5 that is as stiff as possible and independent of ambient influences, the measuring structure 5 itself should be constructed in a fashion that is as light and yet stable as possible, for example, from tetrahedral struts or the like. Particularly suitable as materials in this case are materials that have thermal expansion coefficients which vanish macroscopically at least approximately because of their microscopic structure, such that temperature influences have no influence on the measuring structure 5. Such materials can be Invar ZERODUR or ULE, for example, ZERODUR and/or ULE having proved themselves to be particularly well suited.

In addition to the decoupling with regard to forces and vibrations, in the case illustrated in the exemplary embodiment in accordance with FIG. 1, the decoupling from the spring means 6 and the damper 7 ensures decoupling between the assembly, uninfluenced by thermal fluctuations, of the measuring structure 5 and the assembly, varying because of thermal length expansions, of the base plate 4 and the load-dissipating structure 3.

As illustrated in principle in FIG. 1, the measuring structure 5 has devices 8 as indicated for measuring the exact position of the optical elements 2 with reference to the measuring structure 5 as reference frame. In accordance with the illustration of the principle in FIG. 1, the devices 8 are designed such that no direct contact occurs in the region of these devices 8 between the measuring structure 3 and the respective optical element 2 or its load-dissipating structure 3. For example, in order to measure the position of the optical element 2, the devices 8 can be designed as contactless sensors 9. Suitable types of sensors would certainly in this case be capacitive ranging sensors or, where appropriate, also inductive sensors.

FIG. 2a now shows one possibility of arranging such sensors 9, which are to be capacitive ranging sensors 9 in the present case. FIG. 2a shows a cube corner 10 that is arranged in a three-dimensional illustration and is formed from three planes 11a, 11b, 11c that intersect at an angle of 90° to one another in each case. Such a cube corner 10 can for example, be permanently connected to the respective optical element 2 and then corresponds to a three-dimensional corner 12, as illustrated in FIG. 2b, that is connected permanently to the measuring structure 5. The three-dimensional corner 12 also consists of three planes 11a, 11b, 11c that intersect at a point at an angle of 90° from one another in each case.

In order now to be able to measure changes in position of the optical element 2 in all six degrees of freedom, via such a cube corner 10 with a corresponding three-dimensional corner 12, two sensors 9 are arranged in each case in each of the planes 11a, 11b, 11c. It would also be conceivable in principle respectively to arrange three sensors 9 in one of the planes 11a, two in the next plane 11b, and one sensor 9 in the last plane 11c. However, the assembly illustrated in FIGS. 2a and 2b has the advantage that it is possible to achieve a very exact measurement with the aid of simple means that can be implemented very easily mechanically, this measurement respectively constituting an absolute measurement in the case of the use of such capacitively designed sensors 9. The respective pair of the sensors 9 in the respective plane 11a, 11b, 11c is arranged in this case such that an imaginary connecting line 13 between the two sensors 9 is at an angle of approximately 60° to 120°, preferably at a right angle, to an angle bisector 14. In this case, the angle bisector 14 proceeds from the point of intersection of the three planes 11a, 11b, 11c and runs as angle bisector 14 between the lines of intersection that form with the two neighboring planes the respective plane 11a, 11b, 11c in which the angle bisector 14 lies. With the aid of this assembly of the sensors 9 both in the cube corner 10 and in the corresponding three-dimensional corner 12, it is possible to measure the position of the respective optical element 2 in absolute terms in all six degrees of freedom.

In order to achieve an ideal mode of operation of the optical system 1, each of the optical elements 2 should in this case have such devices 8 for determining its position.

In addition to the abovementioned possibility of permanently connecting the optical element 2 to the cube corner 10 or where appropriate to the three-dimensional corner 12, and of implementing the corresponding counter piece, that is to say the three-dimensional corner 12 or the cube corner 10, in the region of the measuring structure 5, the possibility also exists that the optical element 2 itself contains the three planes 11a, 11b, 11c that are perpendicular to one another.

FIG. 3 illustrates such an assembly, in which there are provided in the edge region of the optical element 2 the respective planes 11a, 11b, 11c that support the corresponding sensors 9. Here, as well, the corresponding planes 11a, 11b, 11c with the respective counter pieces of the sensors 9 are arranged on the measuring structure 5 such that the measurement is carried out in absolute terms with reference to the measuring structure 5.

Of course, the planes 11a, 11b, 11c need not be existing as such in this case. It suffices for the sensors 9 to be arranged in the respective virtual plane 11a, 11b, 11c.

FIG. 4 now shows an alternative design of the optical system 1 in which, as first difference, the connection between the measuring structure 5 and the base plate 4 is constructed as a direct mechanical connection. Depending on the external circumstances, this can be possible, if appropriate, if no excessively strong influences are expected to be exerted on the base plate 4 by the load-dissipating structure 3. Depending on the material used for the measuring structure 5, it may also be expedient here to effect a decoupling from the thermal expansions, which can be done, for example, by means of appropriate materials that are designed with a microstructure such that in macroscopic terms they include a transition from a specific thermal expansion coefficient at one end to another thermal expansion coefficient at their other end.

The devices 8 for measuring the position of the optical elements 2 are implemented in the exemplary embodiment illustrated here as interferometric measuring sections 16, 16' formed by laser interferometers 15. More details will be given in the further course of the exemplary embodiment on the differences between the interferometric measuring section 16, indicated by continuous arrows and the interferometric measuring sections 16' indicated by dotted arrows.

In the case of the above described absolute measurement of the position of the individual optical elements 2 with the aid of the capacitive sensors 9, the measuring structure 5 must project very closely to the optical element to be measured. This can sometimes lead to conflicts with the load-dissipating structure 3 in the case of the design of such an optical system 1. The interferometric measuring sections 16, 16' do not exhibit this problem, since their starting point in the region of the measuring structure 5 can also, if appropriate, exhibit a comparatively large spacing from the optical element 2 that is to be measured with regard to its position In order to be able to work appropriately with the laser interferometers 15, all that is required for this purpose is to keep free appropriate paths for the beams, which usually have a diameter of a few millimeters in each case. Such beam paths, implemented by means of bores with a diameter of 5 mm, for example, are very easy to implement in designing the load-dissipating structure 3, and have scarcely any influence on its strength.

Because of the very small movements occurring, it is, moreover, possible to use interferometers 15 with triple mirrors whose characteristics can then be taken into account in positional calculations, performed by an electronic data processing unit that is not explicitly illustrated here, of the individual optical elements 2 in all degrees of freedom.

As already mentioned above, the aim in this case is that it is possible for the current position of each of the optical elements 2 to be measured in six degrees of freedom, if possible. By analogy with the six capacitive sensors 9 used above, it is consequently possible to use six laser interferometers 15 for each optical element 2 to be measured.

FIG. 5 shows an illustration of the principle of this design, only three of the laser interferometers 15 being illustrated here. The beams, emanating from the laser interferometers 15, of the respective measuring section 16, 16' are reflected in this case by retroreflectors 17 that are arranged in the region of the optical element 2. It is also particularly favorable here, again, when these retroreflectors 17 are arranged on the optical element in the way such as was described for the configuration of the planes 11a, 11b, 11c in the exemplary embodiment in accordance with FIG. 3. It would thus be conceivable that the retroreflectors 17 could be fitted on the optical element itself in the edge region thereof.

In order, now, to be able to measure the position of the respective optical element 2 in all six degrees of freedom, there is a need, as already mentioned above, for six laser interferometers 15. The laser interferometer 15 should be arranged such that three of the laser interferometers measure the optical element 2 obliquely from above, as is indicated in FIG. 4 by the measuring sections 16. By contrast with what has just been described, the three remaining laser interferometers 15 should measure the optical element obliquely from below, as is indicated by the measuring section 16' in FIG. 4.

In order to achieve an ideal result, the individual measuring sections 16, 16' should be arranged here in each case at the appropriate angles relative to one another. This design may be seen in plan view in FIG. 6, the three measuring sections 16 coming from above being arranged at an angle of 120° to one another in each case. The three measuring sections 16' coming from below are likewise arranged at an angle of 120° to one another and at an angle of 60° to the measuring sections 16 in each case. This design can be used to detect the position of the optical element 2 in all six degrees of freedom, and to measure it exactly and independently of the influences of dynamic and static forces in the optical system 1 on the basis of the separation of the load-dissipating structure 3 exposed to the corresponding forces from the measuring structure 5 incorporating the reference. Since the laser interferometers 15 measure only incrementally, it is necessary to load a sensible starting value for the position at the start of the respective system via the electronic data processing unit already mentioned above (and not illustrated). For example, a reference point is approached for this purpose and the exact position thereof with reference to the measuring structure 5 is then defined as zero.

If the optical elements are situated in a rest position within the same counting periods of the laser interferometers 15, for example at 632/2 nm, this offset need then be measured or determined only once. This value can be used to implement all further determinations or calculations of position. A renewed referencing need not then be carried out until the reference point has migrated out of the counting period. However, this is of secondary importance, since this case will scarcely occur in practice. The required references are therefore limited in practice to the respective connection of the optical system 1.

In principle, it would be possible to carry out the measurement in an overdetermined fashion in the case of both designs, that is to say in the case of a use both of the laser interferometers 15 and of the sensors 9. This would mean that at least seven sensors 9 or measuring sections 16, 16' are used instead of the six mandatory sensors 9 or measuring sections 16, 16'. Thus, the measurement can be rendered more reliable via the calculation of position performed in the electronic data processing unit. Moreover, such a design with at least seven devices 8 for determining the position of in each case one of the optical elements 2 would have the result that, when use is made of interferometric measuring sections 16, 16', the above named problem of the generation of starting values or of approaching a reference point would no longer occur, since an appropriate calculation of absolute positional values would also be possible here owing to the overdetermined measurement.

In addition to the very favorable influences on the imaging quality of an optical system 1 designed in accordance with the above described exemplary embodiments, the optical system 1 according to the invention renders it possible, furthermore, to implement a method in which the position of an object and/or an image in the optical system 1 can be varied.

It would be conceivable in principle that the optical elements 2, which can be manipulated in a known way and are situated in the region of the load-dissipating structure 3, could all be displaced exactly in one direction together on the basis of the measuring structure 5 serving as reference frame. If the optical system 1 is used, for example, as an exposure lens in semiconductor lithography, it would therefore be possible to correct a mispositioning of the reticle and/or the wafer in the plane perpendicular to the optical axis. For this purpose, all the optical elements 2 are readjusted with respect to the optical axis in the respective plane by an amount compensating the mispositioning. In the case of a fixed optical system 1, all the optical elements 2 can thus be displaced in one direction such that this corresponds in practice to readjusting the overall optical system 1 with regard to the position of the reticle. This becomes possible, in particular, by virtue of the fact that the dynamic loads further occurring cannot falsify the measurement of the new position, since this is measured in each case with respect to the measuring structure 5 serving as reference frame, and this structure remains uninfluenced by these operations because of the thermal and mechanical decoupling from the remainder of the optical system 1. Something similar would also be conceivable in the case of a tilting of the reticle and/or wafer about the optical axis, although here it would be possible for errors and inaccuracies to occur in the region of the optical system 1 that could only be tolerated with difficulty, if appropriate, depending on requirements.

In any case, it would be conceivable to use such a design, which renders favorable properties possible in the case of imaging, to economize on very complicated fine positioning both of the wafer and of the reticle in a machine for exposing semiconductor components, since all the optical elements 2 can be readjusted appropriately on the basis of the exact measurability of their position over the measuring structure 5, in order to correct errors in the fine positioning of the reticle or the wafer. It is thereby possible to economize on complicated fine positioning devices for wafer and reticle that are very expensive because of the targeted accuracy in the case of the current prior art. As an ideally operating optical system 1, the optical system 1 should in any case include the above described designs so that the variation in the position of the object and/or image can be implemented with a minimum additional control outlay and without additional components.

What is claimed is:

1. An optical system with a plurality of optical elements, comprising at least one load-dissipating structure, that diverts the forces originating from the optical elements, and a measuring structure which is isolated from said load-dissipating structure, said measuring structure capable of monitoring the position of at least one individual optical element within the optical system.

2. The optical system as claimed in claim 1, wherein said optical system is an exposure lens for semiconductor lithography.

3. The optical system as claimed in claim 1, wherein said measuring structure is integrated in the optical system.

4. The optical system as claimed in claim 1, wherein said measuring structure has devices via which it is possible to measure the position of at least a number of the optical elements relative to the measuring structure.

5. The optical system as claimed in claim 4, wherein said devices for measuring the position are sensors that measure an absolute distance on the respective corresponding counterelement from the measuring structure, at least three sensors being present for each of the optical elements.

6. The optical system as claimed in claim 5, wherein said sensors are capacitive sensors.

7. The optical system as claimed in claim 6, wherein there are provided per optical element at least six sensors that are arranged in three mutually perpendicular planes.

8. The optical system as claimed in claim 7, wherein said sensors of each plane are arranged in pairs, an imaginary connecting line lying between the sensors in each case at an angle of 60° to 120°, to the angle bisector, proceeding from the point of the intersection of the three planes, between the lines of intersection of the respective plane with the neighboring planes in the respective plane with said sensors.

9. The optical system as claimed in claim 8, wherein said angle amounts to 90°.

10. The optical system as claimed in claim 7, wherein a plane in the region of the respective optical element corresponds to each of said planes that is assigned to the region of the measuring structure.

11. The optical system as claimed in claim 10, wherein in the region of the optical element said planes are permanently connected to the optical element as a cube corner.

12. The optical system as claimed in claim 10, wherein in the region of the optical element said planes are designed as reference surfaces on the optical element itself.

13. The optical system as claimed in claim 4, wherein said devices for measuring the position of the optical element are designed as interferometric measuring sections.

14. The optical system as claimed in claim 13, wherein said measuring sections are constructed via laser interferometers, each of the optical elements being assigned at least six laser interferometers that for their part are connected in a stationary fashion to the measuring structure.

15. The optical system as claimed in claim 12, wherein said laser beams of the laser interferometers are reflected by retroreflectors permanently connected to the optical elements, each optical element having at least six retroreflectors, and each of the retroreflectors, and each of the retroreflectors corresponding to one of the laser interferometers.

16. The optical system as claimed in claim 3, wherein there are provided for each optical element at least seven devices for measuring the position of the same.

17. The optical system as claimed in claim 3, wherein absolute position values of the respective optical elements are calculated in an electronic data processing unit from all the values determined by said devices for measuring the position of the optical element.

18. The optical system as claimed in claim 1, wherein said load-dissipating structure and said measuring structure are arranged on a common base plate.

19. The optical system as claimed in claim 1, wherein the connection between said measuring structure and said load-dissipating structure is constructed via a combination of at least one spring means and at least one damper.

20. The optical system as claimed in claim 1, wherein said measuring structure is constructed from a material that, at least macroscopically, has a coefficient of thermal expansion that is at least approximately zero.

21. A method for changing the position of an object in an optical system as claimed in claim 1, wherein the position of the object is varied by varying the position of said optical elements in the optical system, wherein the position of said optical elements in relation to said measuring structure being measured at an at least known position of the object and target position of the image in relation to said measuring structure.

22. A method for changing the position of an image in an optical system as claimed in claim 1, wherein the position of said image is varied by varying the position of said optical elements in the optical system, wherein the position of said optical elements in relation to the measuring structure being measured at an at least known position of the object and target position of the image in relation to said measuring structure.

23. A method for changing the position of an object and an image in an optical system as claimed in claim 1, wherein the position of the object and the image is varied by varying the position of said optical elements in the optical system, wherein the position of said optical elements in relation to the measuring structure being measured at an at least known position of the object and target position of the image in relation to said measuring structure.

* * * * *